United States Patent
Tsai et al.

(10) Patent No.: US 8,062,964 B2
(45) Date of Patent: Nov. 22, 2011

(54) SOLAR CELL DEFECT PASSIVATION METHOD

(75) Inventors: Wen-Fa Tsai, Taoyuan County (TW); Jyong-Fong Liao, Taoyuan County (TW); Yen-Yu Chen, Taipei (TW); Chee Wee Liu, Taipei (TW); Chi-Fong Ai, Taoyuan County (TW)

(73) Assignee: Atomic Energy Council, Taoyuan (TW)

( * ) Notice: Subject to any disclaimer, the term of this patent is extended or adjusted under 35 U.S.C. 154(b) by 0 days.

(21) Appl. No.: 12/853,232

(22) Filed: Aug. 9, 2010

(65) Prior Publication Data

US 2011/0053351 A1    Mar. 3, 2011

(51) Int. Cl.
*H01L 21/26* (2006.01)

(52) U.S. Cl. . 438/513; 438/475; 438/514; 257/E21.212; 257/E21.319; 257/E21.334

(58) Field of Classification Search .................. 438/475, 438/515, 516; 257/E21.319, E21.473
See application file for complete search history.

(56) References Cited

U.S. PATENT DOCUMENTS

2010/0240170 A1* 9/2010 Sun ................................. 438/72
* cited by examiner

*Primary Examiner* — Cheung Lee
(74) *Attorney, Agent, or Firm* — Lee & Hayes, PLLC

(57) ABSTRACT

The present disclosure passivates solar cell defects. Plasma immersion ion implantation (PIII) is used to repair the defects during or after making the solar cell. Hydrogen ion is implanted into absorption layer with different sums of energy to fill gaps of defects or surface recombination centers. Thus, solar cell defects are diminished and carriers are transferred with improved photovoltaic conversion efficiency.

14 Claims, 9 Drawing Sheets

| Shunt resistance<br>Implant time | OriginalRsh (Ω) | PIII treatment Rsh (Ω) |
|---|---|---|
| 60sec | 13.5 | 15.9 |
| 90sec | 14 | 16.5 |
| 120sec | 10.78 | 19.1 |
| 150sec | 13.4 | 21 |

FIG.6B

SOLAR CELL DEFECT PASSIVATION METHOD

CROSS REFERENCE TO RELATED PATENT APPLICATIONS

This application claims priority from Taiwan Patent Application No. 098129686, filed in the Taiwan Patent Office on Sep. 3, 2009, and incorporates the Taiwan patent application in its entirety by reference.

TECHNICAL FIELD

Plasma immersion ion implantation (PIII) is a process method to passivate the possible defects of solar cells to gain the extra efficiency.

DESCRIPTION OF THE RELATED ARTS

For industrial solar cell, there are various materials like mono-crystalline, multi-crystalline, amorphous, and III-V, respectively. According to related studies, 1% improvement in the photovoltaic conversion efficiency of solar cell will obtain about 7% growth of gross profit ratio. However, crystalline defects, interface defects or other defects in the solar cell may be found after fabrication, no matter what the material is.

Now, crystalline silicon solar cell is the main stream because its fabrication procedure is quite close to that of silicon semiconductor. Besides, techniques and facilities for fabricating silicon semiconductor can be efficiently transferred for fabricating crystalline silicon solar cell.

However, crystalline silicon solar cell and a-Si solar cell with single junction have less improvement due to process stress. The increasing dark current (Io) of the solar cell decreases short circuit current (Isc) and open circuit voltage (Voc) may be decreased to make the bad efficiency.

As compared with hydrogen plasma ion implantation by a commercial ion implanter for passivation the defects on the interface and surface, the hydrogen ion implantation is not easy and is not cheap. It is because the commercial ion implanter applies one-dimensional ion beam only. If defects at three dimensions are to be processed, a target holder with three dimensional rotation is required, not to mention the time spent for the process. Hence, the commercial ion implanter is limited in use for passivation on solar cell defects.

Regarding multi-film single-junction solar cell made of a-Si or u-Si, more defects are not found in light absorption layers and interfaces and so photovoltaic conversion efficiency of the multi-film solar cell is worse than that of the crystalline silicon solar cell. Although multi-junction module, like a-Si:H/u-Si:H tandem cell or a-Si:H/a-SiGe:H/a-SiGe:H triple junction cell, can be used to increase absorption range and increase photon current generated, interface defects and crystalline defects may be also increased because number light absorption layers and interfaces of the multi-junction module is increased too. Therein, all defects in the solar cell are recombination centers of carriers obtained from photon excitation. As a result, more carriers are caught at the recombination centers with more defects; and, short circuit current, open circuit voltage and photovoltaic conversion efficiency are thus decreased. Although CVD may be used for fabricating the light absorption layer, the problem is till not solved, especially those defects on interfaces.

Besides, hydrogen plasma may be used for annealing to bombarding on surface with hydrogen ions to remove dangling bonds before a deposition process, where the plasma potential of the hydrogen plasma is smaller than 80 volts. But, the plasma potential is too low to control implantation amount and implantation depth of the hydrogen ion. Only defects on surface can be repaired but not defects in deep area; and so photovoltaic conversion efficiency can not be improved much. Hence, the prior arts do not fulfill all users' requests on actual use.

SUMMARY OF THE PRESENT DISCLOSURE

The main purpose of the present disclosure is to passivate defects with hydrogen PIII treatment for improving photovoltaic conversion efficiency.

Hydrogen PIII treatment is an easy, cheap, high throughput and omnidirectional implantation for current solar cell process to passivate the interface defects of crystalline silicon, micro-crystalline silicon or other type solar cells.

To achieve the above purposes, the present disclosure is a solar cell defect passivation method, comprising steps of putting a solar optoelectronic device into a PIII device; and obtaining a plasma of an ion and three-dimensionally repairing defects of the solar optoelectronic device through implantation of the ion with a voltage waveform of a pulse, an implantation energy and an implantation time, where width of the pulse is greater than 1 microsecond ($\mu s$); negative bias of the pulse is up to −65 kilovolts (kV); and frequency of the pulse is up to 20 kilo-hertz (kHz) and is obtained according to the negative bias of the pulse, the width of the pulse and the implantation time. Accordingly, a novel solar cell defect passivation method is obtained.

BRIEF DESCRIPTION OF THE DRAWINGS

The present disclosure will be better understood from the following detailed descriptions of the preferred embodiments according to the present disclosure, taken in conjunction with the accompanying drawings, in which

FIG. 6B is a chart showing the comparison of shunt resistance between different treatment times and untreated samples.

DESCRIPTION OF THE PREFERRED EMBODIMENTS

The following descriptions of the preferred embodiments are provided to understand the features and the structures of the present disclosure.

Figure 1A:
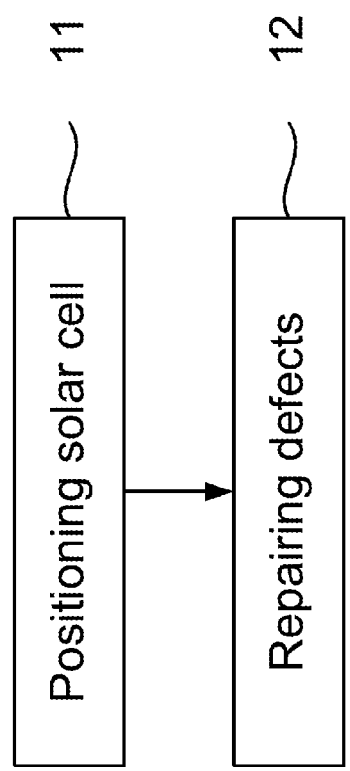
FIG. 1A is a flowchart showing the first preferred embodiment according to the present disclosure.
Figure 1B:
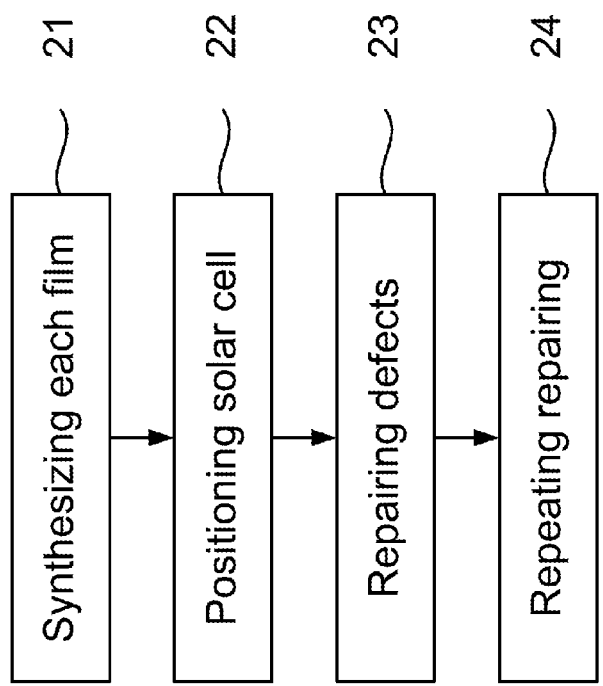
FIG. 1B is a flowchart showing the second preferred embodiment.

Please refer to FIG. 1A and FIG. 1B, which are flow views showing a first preferred embodiment and a second preferred embodiment according to the present disclosure. As shown in the figures, the present disclosure is a solar cell defect passivation method, where plasma immersion ion implantation (PIII) is used to repair defects of a solar optoelectronic device. In a first preferred embodiment, a passivation process for repairing defects of a wafer solar cell through ion implantation comprises the following steps:

(a1) Positioning solar cell 11: A solar optoelectronic device is put into a PIII device, where the solar optoelectronic device is a wafer solar cell made of crystalline silicon or polycrystalline silicon.

(b1) Repairing defects 12: A plasma of an ion is selected to three-dimensionally repair defects of the solar optoelectronic device through implantation of the ion with a voltage waveform of a pulse, an implantation energy and an implantation time, where the plasma is a gas plasma of hydrogen ion, nitrogen ion or carbon ion.

In a second preferred embodiment, a passivation process for repairing defects of a multi-film solar cell through ion implantation comprises the following steps:

(a2) Synthesizing each film 21: Each film of the solar cell is synthesized.

(b2) Positioning solar cell 22: The solar cell is put into a PIII device.

(c2) Repairing defects 23: A plasma of an ion is selected to three-dimensionally repair defects of the film of the solar cell through implantation of the ion with a voltage waveform of a pulse, an implantation energy and an implantation time.

(d2) Repeating repairing 24: Step (a2) to step (c2) are repeated to finish syntheses of all films.

During the passivation, the implantation energy is smaller than 5 kiloelectron volts (keV) and is obtained according to a depth of process to avoid extra defects; the implantation time is smaller than 300 seconds (sec) and is obtained according to the depth of process, a negative bias of the pulse, a width of the pulse and a frequency of the pulse; and, a rise time, a width of time and a fall time of a voltage waveform of the pulse is changeable to control implantation area of the ion and distribution of energy of the ion in the implantation area for implanting ions around interfaces.

The pulse used for the PIII passivation according to the present disclosure has a width greater than 1 microsecond (µs); a negative bias up to −65 kilovolts (kV); and a frequency up to 20 kilo-hertz (kHz) according to the negative bias, the width and the implantation time.

Thus, a novel solar cell defect passivation method is obtained.

Figure 2:
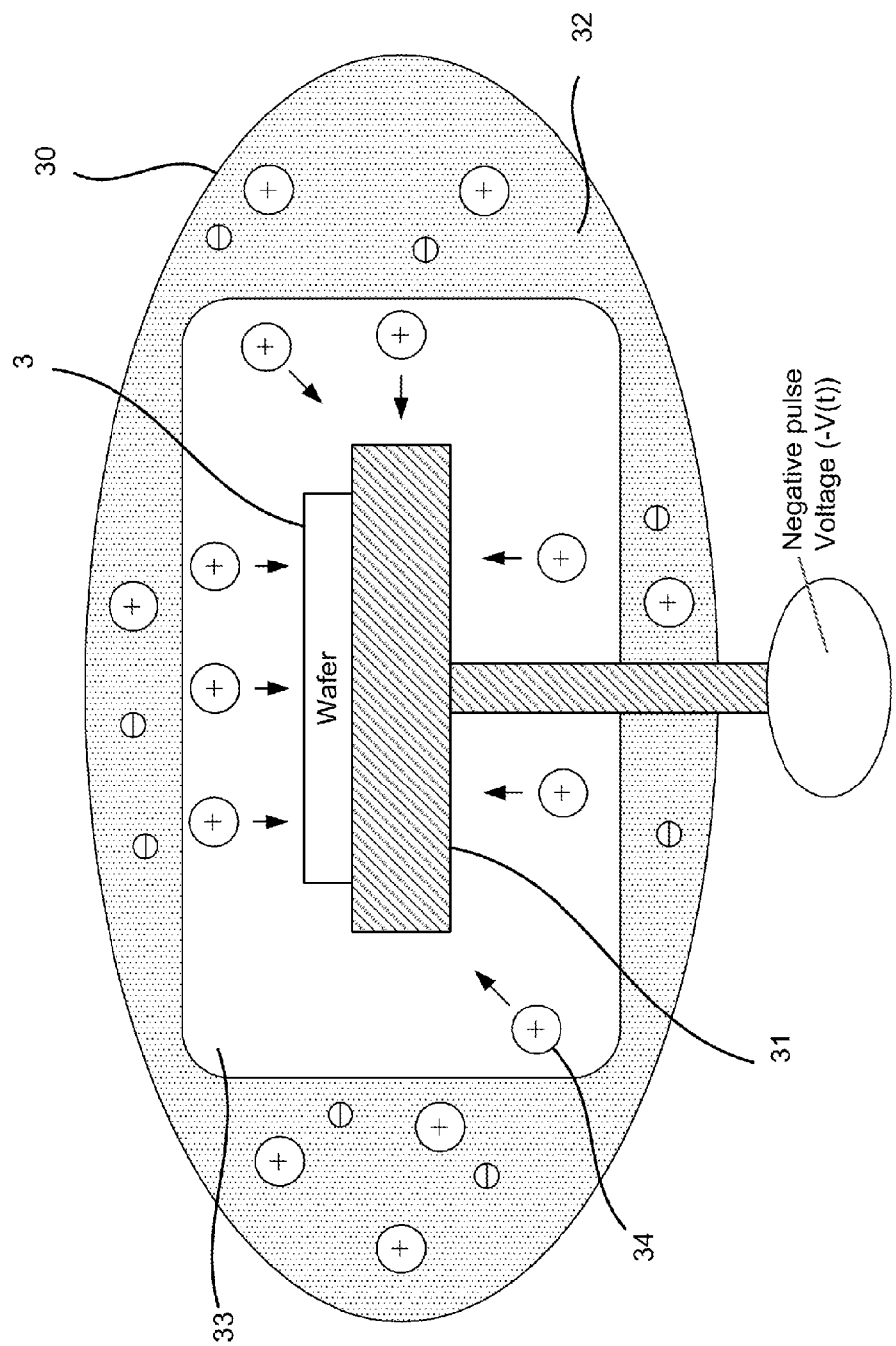
FIG. 2 is a diagram showing plasma immersion ion implantation according to the present disclosure.

FIG. 2 is a view showing plasma immersion ion implantation. As shown in the figure, a wafer solar cell 3 is put on a target holder 31 in a vacuum chamber 30. The vacuum chamber 30 is vacuumed into $1 \times 10^{-6}$ Torr. Then, hydrogen is filled in to obtain a pressure around $1 \times 10^{-3}$ Torr. Thus, hydrogen plasma 32 is obtained as an inductively coupled plasma (ICP), whose density is about $5 \times 10^{9}/cm^{3}$. A pulse voltage smaller than 5 kV is applied on the target holder 31 for implanting plasma ions 34 on the solar cell 3 in a plasma sheath 33. Concentration dose and depth distribution of hydrogen ion implantation are controlled for the passivation of the solar cell 3 with hydrogen by changing the implantation time, the width of the pulse, the strength of the pulse, the frequency of the pulse and the RF power. Thus, carrier transportation behavior is enhanced and photovoltaic conversion efficiency is improved.

Figure 3:
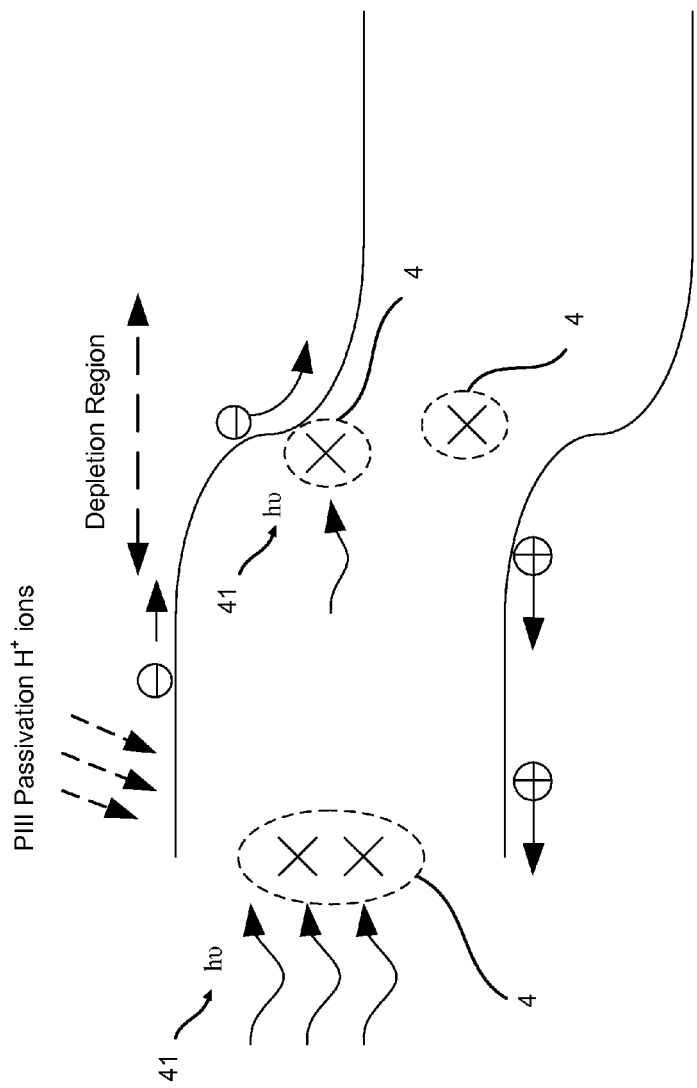
FIG. 3 is a diagram showing the influence of the solar cell defect on the photovoltaic conversion efficiency.

FIG. 3 is a view showing influence of solar cell defect on photovoltaic conversion efficiency. As shown in the figure, when electrons and holes are obtained in a solar cell through photon excitation h υ 41 and some carriers spread toward carrier depletion regions, the electrons and holes may be recombined owing to defects 4; and, photon current may thus be reduced. The present disclosure implants hydrogen ions on the solar cell through PIII, where defects of the solar cell are passivated by the hydrogen ions to reduce possibility of the recombination and to thus improve photovoltaic conversion efficiency of the solar cell.

Figure 4:
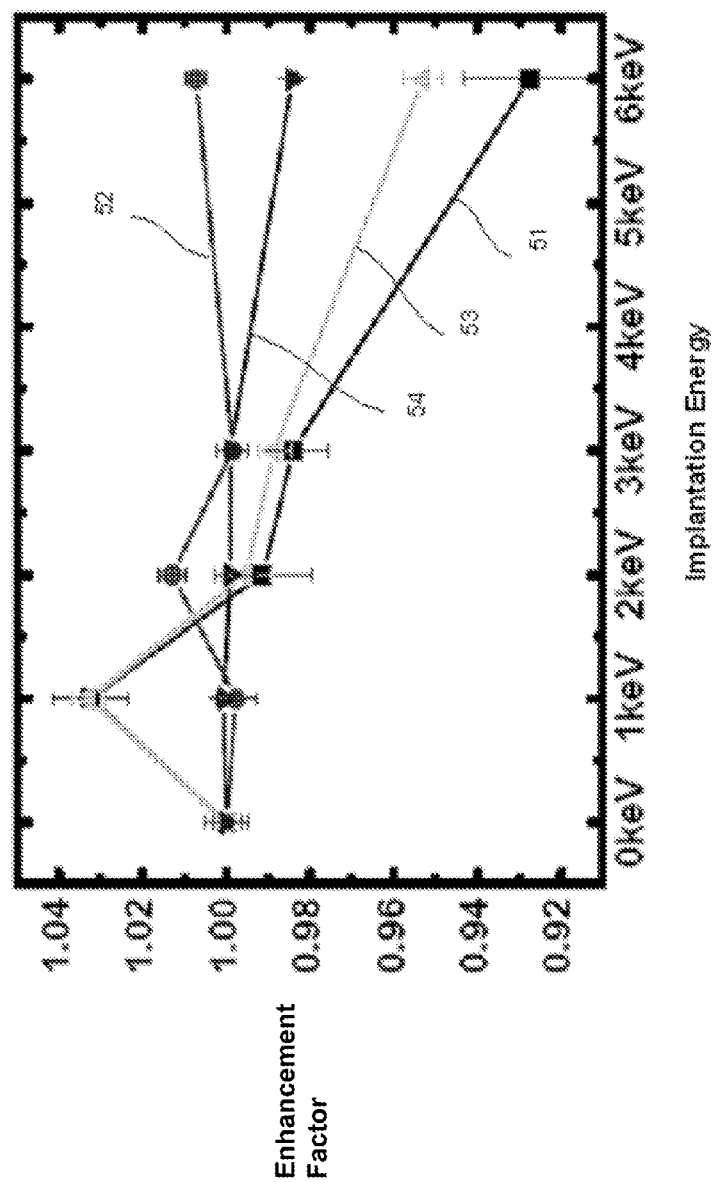
FIG. 4 is a chart showing the influence of the treatment voltages on the photovoltaic conversion efficiency.

FIG. 4 is a view showing influence of treatment voltages on photovoltaic conversion efficiency. As shown in the figure, photovoltaic conversion efficiencies, fill factors, short circuit currents and open circuit voltages of a solar cell are measured under pulses having a 200 Hz frequency, a 20 µs width and a 60 sec implantation time. As shown in four enhancement curves of photovoltaic conversion efficiency 51~54, a best pulse voltage for passivation is −1 kV, where the photovoltaic conversion efficiency is enhanced about 3~4% after hydrogen ion implantation.

Figure 5:
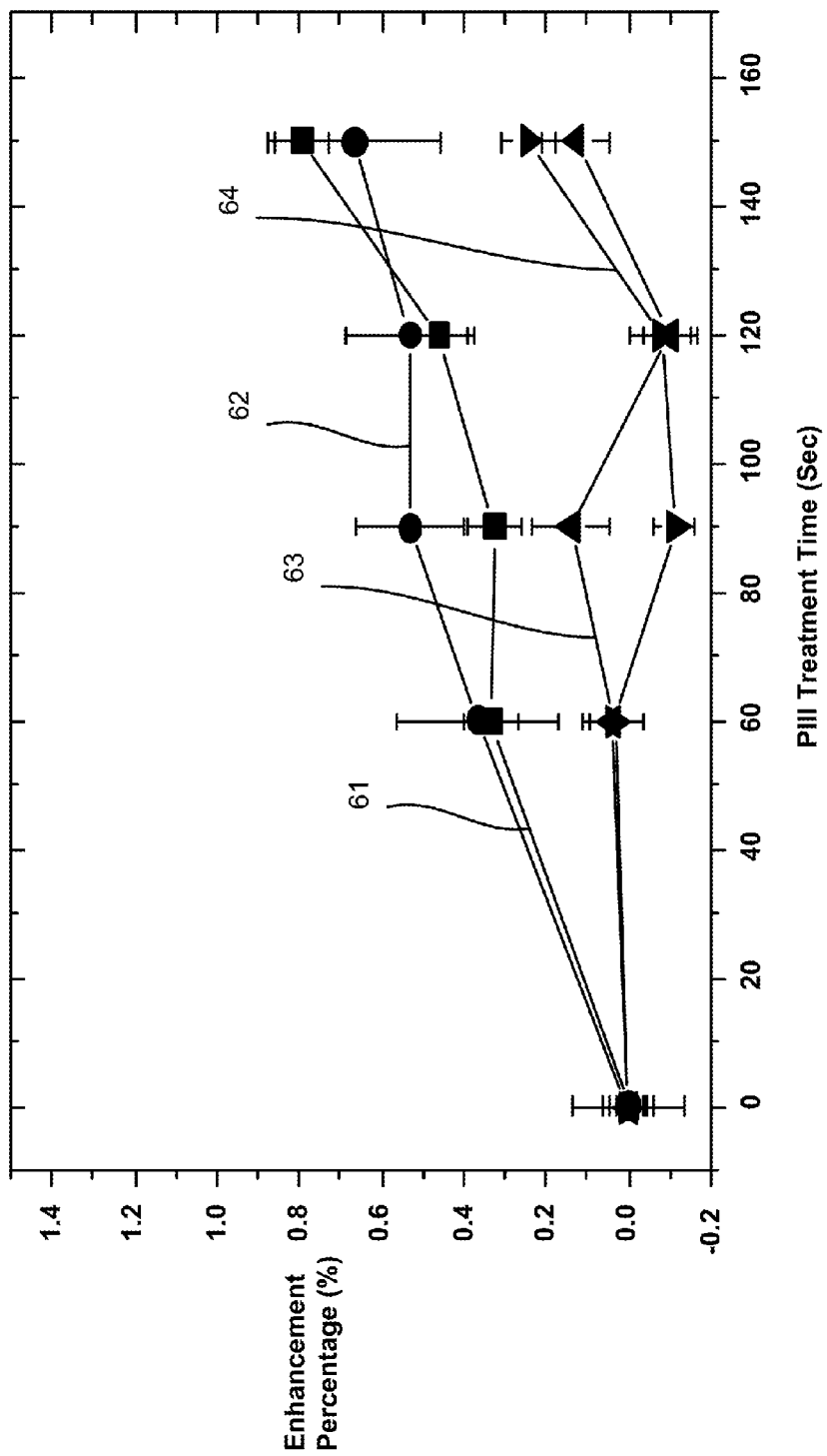
FIG. 5 is a chart showing the influence of the treatment time on the photovoltaic conversion efficiency.

FIG. 5 is a view showing influence of treatment time on photovoltaic conversion efficiency. As shown in the figure, photovoltaic conversion efficiencies, fill factors, short circuit currents and open circuit voltages of a crystalline silicon solar cell are measured with different periods of time of hydrogen ion implantation under pulses having a −1 kV pulse voltage, a 200 Hz frequency and a 20 µs width. As shown in four enhancement curves of photovoltaic conversion efficiency 61~64, photovoltaic conversion efficiency is increased as the period of time of hydrogen ion implantation is increased, where the efficiency is increased 0.8% for 150 sec. Thus, hydrogen ion implantation is used in the present disclosure to repair crystalline defects and interface defects in a solar cell; and, furthermore, leakage current is reduced, shunt resistance is increased and fill factor is improved.

Figure 6A:
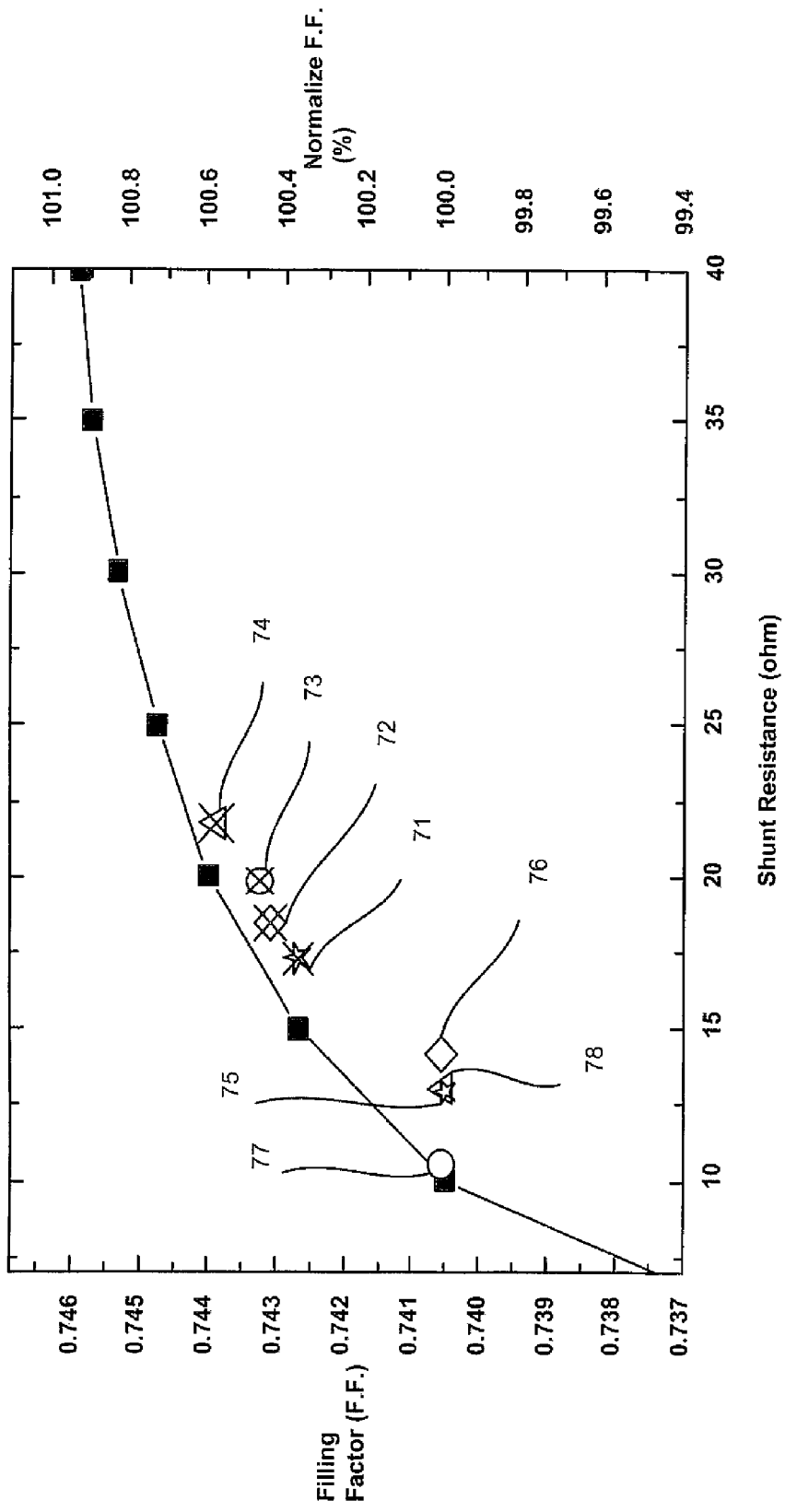
FIG. 6A is a chart showing the relationship between the fill factors and the shunt resistances.

FIG. 6A and FIG. 6B are a view showing relationships between fill factors and shunt resistances; and a view showing a comparison of shunt resistance between different treatment times and untreated samples. As shown in the figures, software is used in the present disclosure to obtain relationships between fill factors and shunt resistances. A crystalline silicon solar cell is processed through hydrogen ion implantation for 60 sec, 90 sec, 120 sec and 150 sec to obtain first shunt resistance data 71~74 for comparing with second shunt resistance data 75~78 of a solar cell which is not processed through passivation. Through a hydrogen ion implantation at −1 kV voltage for 150 sec, the shunt resistance of the crystalline silicon solar cell is raised from 13.4 ohms (Ω) to 21Ω and the fill factor is increased for 0.6%.

Figure 7:
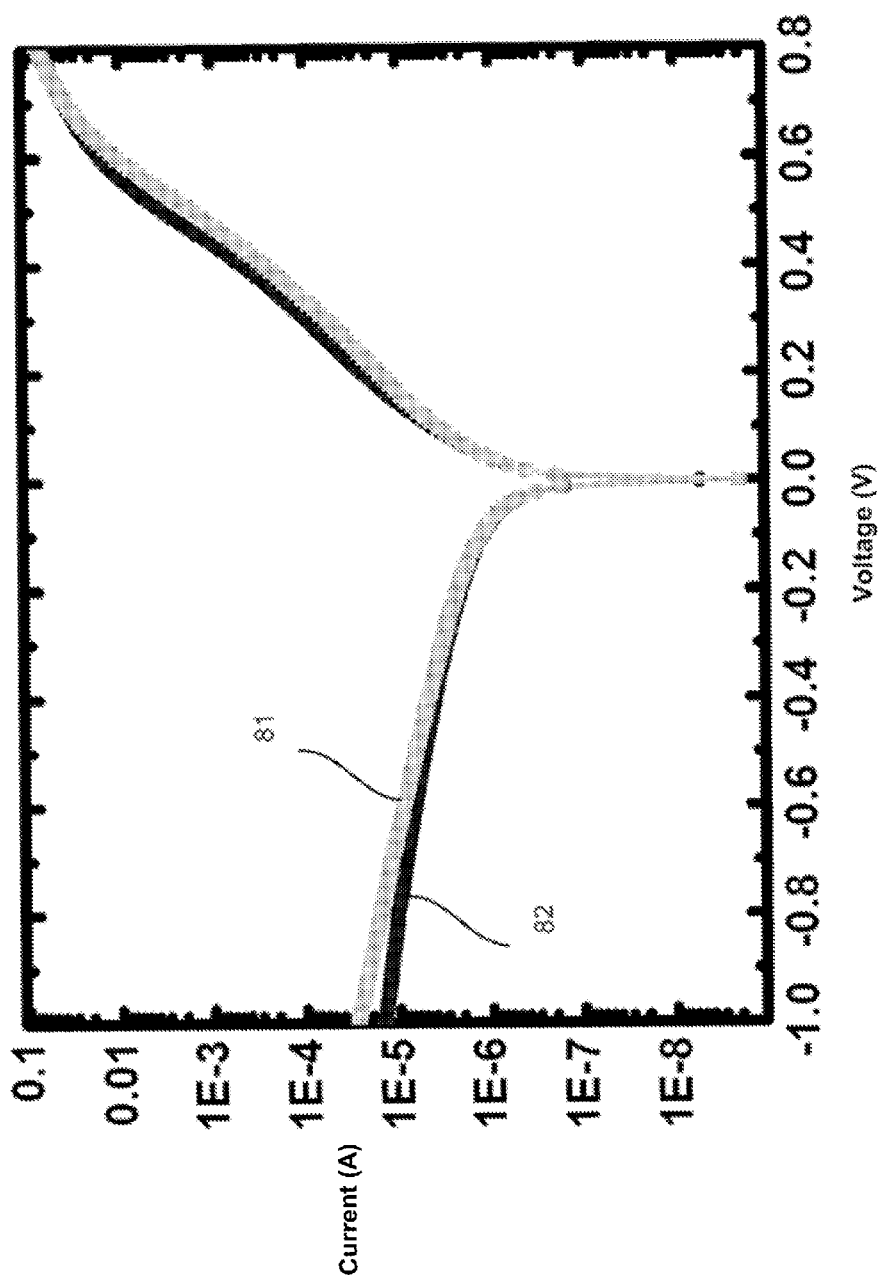
FIG. 7 is a chart showing the current-voltage relationship between passivation and untreated samples.

FIG. 7 is a view showing a current-voltage relationship between passivation and untreated samples. As shown in the figure, a dark current of a crystalline silicon solar cell which is processed through passivation at −1 kV voltage for 90 sec is compared with that of a solar cell which is not processed through passivation. As shown in the curve for the passivated solar cell 81 and that for the non-passivated solar cell 82, the dark current of the passivated solar cell 81 is reduced for 49% to that of the non-passivated solar cell 82 owing to reduced number of defects.

As shown above, on using PIII according to the present disclosure, a plasma source in a chamber is used with a negative pulse voltage applied on a target holder. Then, an implantation energy and an implantation time are set to decide a implantation depth for the target and a plasma ion dose to be implanted, where the plasma ions are implanted three dimensionally. Thus, crystalline defects or interface defects of a wafer solar cell or a multi-film solar cell are passivated by hydrogen ions for preventing recombination of carriers at defects. Hence, advantages of the present disclosure are as follows:

(1) Commercial ion implanter generally processes implantation at one dimension only. Plasma annealing for passivating solar cell defects in a light absorption layer usually has lower energy. The present disclosure solves these problems.

(2) Short circuit current (Isc), open circuit voltage (Voc) and fill factor (F.F.) will decrease if defects of material or defects on interface increase; and, defects on surface will recombine the photo-generated electron-hole pairs at short wavelength. The present disclosure increases photo current obtained at short wavelength. However, the fill factor decreases due to increasing defects as surface recombination center. Moreover, the series resistance (Rs) increases and the shunt resistance (Rsh) decreases due to defects. Hence, effects of defect and leakage current on Rs and Rsh are solved by the PIII passivation treatment according to the present disclosure.

(3) The depth of hydrogen can be controlled by the tunable pulse voltage. With simulation and experiment results, the suitable power and treatment time can be detected for optimization. For single-crystalline silicon solar cell, the optimization results can gain higher efficiency.

(4) Defects can be generated during texture fabrication and other structure process. The present disclosure ameliorates the above situation with PIII passivation process and reduces edge defects also.

Thus, the present disclosure can be applied to a sensor, a detector, a light emitting diode, a laser device or a fiber device to improve quantum efficiency due to defects passivation with PIII treatment.

To sum up, the present disclosure is a solar cell defect passivation method, where hydrogen ions are implanted into light absorption layer of a solar cell to repair interface defects of light absorption layer and defects of surface recombination center for improving carrier transportation behavior and enhancing photovoltaic conversion efficiency of the solar cell.

The preferred embodiments herein disclosed are not intended to unnecessarily limit the scope of the present disclosure. Therefore, simple modifications or variations belonging to the equivalent of the scope of the claims and the instructions disclosed herein for a patent are all within the scope of the present disclosure.

What is claimed is:

1. A defect passivation method for solar, the method comprising:
   putting a solar optoelectronic device into a device of plasma immersion ion implantation (PIII); and
   obtaining a plasma of an ion and omnidirectional hydrogen implantation for defect passivation of said solar optoelectronic device through implanting said ion with a voltage waveform of a pulse, an implantation energy, and an implantation time,
   wherein a width of said pulse is greater than 1 microsecond (µs);
   wherein a negative bias of said pulse is up to −65 kilovolts (kV); and
   wherein a frequency of said pulse is up to 20 kilo-hertz (kHz) and is obtained according to said negative bias of said pulse, said width of said pulse, and said implantation time.

2. The method according to claim 1, wherein, in obtaining said plasma of said ion and omnidirectional hydrogen implantation for defect passivation of said solar optoelectronic device, said plasma is a gas plasma of an ion selected from a group consisting of hydrogen ion, nitrogen ion and carbon ion.

3. The method according to claim 1, wherein, in obtaining said plasma of said ion and omnidirectional hydrogen implantation for defect passivation of said solar optoelectronic device, said implantation energy is smaller than 5 kilo-electron volts (keV) and is obtained according to a depth of process to avoid extra defects.

4. The method according to claim 1, wherein, in obtaining said plasma of said ion and omnidirectional hydrogen implantation for defect passivation of said solar optoelectronic device, said implantation time is shorter than 300 seconds (sec) and is obtained according to a depth of process, said negative bias of said pulse, said width of said pulse and said frequency of said pulse.

5. The method according to claim 1, wherein, in obtaining said plasma of said ion and omnidirectional hydrogen implantation for defect passivation of said solar optoelectronic device, a rise time, a width of time and a fall time of said voltage waveform of said pulse is changeable to control implantation area of said ion and distribution of energy of said ion in an implantation area.

6. The method according to claim 1,
   wherein said solar optoelectronic device is a wafer solar cell; and
   wherein said wafer solar cell is made of a material selected from a group consisting of crystalline silicon and poly-crystalline silicon.

7. The method according to claim 1, wherein said solar optoelectronic device is selected from a group consisting of a sensor, a detector, a photon excitation diode, a laser device and a fiber device.

8. A solar cell defect passivation method, the method comprising:
   synthesizing each film of a solar optoelectronic device;
   putting said solar optoelectronic device into a PIII device;
   obtaining a plasma of an ion and three-dimensionally repairing defects of said film of said solar optoelectronic device through implantation of said ion with a voltage waveform of a pulse, an implantation energy, and an implantation time; and
   repeating above actions to finish syntheses of all films of said solar optoelectronic device,
   wherein width of said pulse is greater than 1 µs;
   wherein negative bias of said pulse is up to −65 kV; and
   wherein frequency of said pulse is up to 20 kHz which is changeable according to said negative bias of said pulse, said width of said pulse, and said implantation time.

9. The method according to claim 8, wherein, in obtaining said plasma of said ion and three-dimensionally repairing defects of said film of said solar optoelectronic device, said plasma is a gas plasma of an ion selected from a group consisting of hydrogen ion, nitrogen ion and carbon ion.

10. The method according to claim 8, wherein, in obtaining said plasma of said ion and three-dimensionally repairing defects of said film of said solar optoelectronic device, said implantation energy is smaller than 5 keV and is obtained according to a depth of process to avoid extra defects.

11. The method according to claim 8, wherein, in obtaining said plasma of said ion and three-dimensionally repairing defects of said film of said solar optoelectronic device, said implantation time is shorter than 300 sec and is obtained according to a depth of process, said negative bias of said pulse, said width of said pulse and said frequency of said pulse.

12. The method according to claim 8, wherein, in obtaining said plasma of said ion and three-dimensionally repairing defects of said film of said solar optoelectronic device, a rise time, a width of time and a fall time of said voltage waveform of said pulse is changeable to control implantation area of said ion and distribution of energy of said ion in an implantation area.

13. The method according to claim 8,
wherein said solar optoelectronic device is a multi-film solar cell; and
wherein said multi-film solar cell is a single junction device made of a material selected from a group consisting of amorphous silicon (a-Si), a-Si alloy, n-Si, microcrystal-line silicon (u-Si) and III-V group semiconductor.

14. The method according to claim 8, wherein said solar optoelectronic device is selected from a group consisting of a sensor, a detector, a light emitted diode (LED), a laser device and a fiber device.

* * * * *